(12) United States Patent
Allred

(10) Patent No.: US 7,058,188 B1
(45) Date of Patent: Jun. 6, 2006

(54) CONFIGURABLE DIGITAL LOUDNESS COMPENSATION SYSTEM AND METHOD

(75) Inventor: Rustin W. Allred, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/421,417

(22) Filed: Oct. 19, 1999

(51) Int. Cl.
*H03G 3/00* (2006.01)
*H03G 5/00* (2006.01)

(52) U.S. Cl. .................. 381/107; 381/104; 381/103
(58) Field of Classification Search ........ 381/104–109, 381/58, 103; 700/94
See application file for complete search history.

(56) References Cited

U.S. PATENT DOCUMENTS

| | | | |
|---|---|---|---|
| 4,490,843 A | 12/1984 | Bose et al. | |
| 4,739,514 A | 4/1988 | Short et al. | |
| 4,875,400 A * | 10/1989 | Okuda et al. | 84/626 |
| 4,991,218 A * | 2/1991 | Kramer | 381/61 |
| 5,361,381 A | 11/1994 | Short | |
| 5,500,902 A * | 3/1996 | Stockham et al. | 381/320 |
| 5,524,060 A * | 6/1996 | Silfvast et al. | 381/104 |
| 5,524,074 A * | 6/1996 | Massie | 381/62 |
| 5,956,494 A * | 9/1999 | Girardeau et al. | 712/209 |
| 6,195,029 B1 * | 2/2001 | Urry et al. | 341/138 |
| 6,289,367 B1 * | 9/2001 | Allred | 708/277 |
| 6,317,117 B1 * | 11/2001 | Goff | 345/156 |

OTHER PUBLICATIONS

S.S. Stevens, "Perceived Level of Noise by Mark VII and Decibels (E)", *The Journal of the Acoustical Society of America*, vol. 51, No. 2 (Part 2) 1972, pp. 575-601.

Tomlinson Holman and Frank Kampmann, "Loudness Compensation: Use and Abuse*", *Journal of the Audio Engineering Society*, Jul./Aug. 1978, vol. 26, No. 7/8, pp. 526-536.

(Continued)

*Primary Examiner*—Laura A. Grier
(74) *Attorney, Agent, or Firm*—W. James Brady, III; Frederick J. Telecky, Jr.

(57) ABSTRACT

An audio loudness compensation system includes a level sensor receiving an audio input signal and operable to estimate a level of the audio input signal over a first predetermined time period, and a level mapper receiving the estimated level and operable to map the estimated level to a raw audio gain in response to a slope setting and an offset setting. The system further includes an attack and decay filter receiving the raw audio gain and operable to smooth out increasing and decreasing changes in the raw audio gain in response to a second and, possibly a third predetermined time period, and a compensation filter receiving the smoothed raw audio gain and operable to modify the audio input signal in response to the smoothed raw audio gain, a center frequency setting and a bandwidth setting, and generate a loudness compensated audio output signal.

24 Claims, 3 Drawing Sheets

OTHER PUBLICATIONS

Arthur L. Newcomb, Jr., and Richard N. Young, "Practical Loudness: An Active Circuit Design Approach", *Journal of the Audio Engineering Society*, Jan./Feb. 1976, vol. 24, No. 1, pp. 32-35.

Itai Neoran and Meir Shashua, "A Perceptive Loudness-Sensitive Leveler for Audio Broadcasting and Mastering", Presented at the 105th Convention of the Audio Engineering Society on Sep. 26-29, 1998, San Francisco, California, pp. 1-9.

Jon Dattorro, "Effect Design*—Part 1: Reverberator and Other Filters", *J. Audio Eng. Soc.*, vol. 45, No. 9, Sep. 1997, p. 660-684.

Jon Dattorro, "Effect Design*—Part 2: Delay-Line Modulation and Chorus", *J. Audio Eng. Soc.*, vol. 45, No. 10, Oct. 1997, pp. 764-788.

* cited by examiner

CONFIGURABLE DIGITAL LOUDNESS COMPENSATION SYSTEM AND METHOD

RELATED PATENT APPLICATION

This patent application is related to U.S. non-provisional Ser. No. 09/407,552, entitled Digital Audio Dynamic Range Compressor And Method, filed on Sep. 27, 1999; U.S. non-provisional Ser. No. 09/408,095, entitled Digital Tone Control with Linear Step Coefficients, filed on Sep. 27, 1999; U.S. non-provisional Ser. No. 09/401,422, entitled Digital Graphic Equalizer Control System and Method, filed on Sep. 22, 1999; and U.S. non-provisional Ser. No. 09/192,981, titled Digital Signal Processing Circuits, Systems, and methods Implementing Approximations for Logarithm and Inverse Logarithm, filed on Nov. 16, 1998, all of which are incorporated herein by reference.

TECHNICAL FIELD OF THE INVENTION

This invention is related in general to the field of digital circuits. More particularly, the invention is related to a configurable digital loudness compensation system and method.

BACKGROUND OF THE INVENTION

It has been long understood that the human ear perception of loudness varies with frequency when the sound pressure level is held constant. Although recording engineers may attempt to compensate for the non-flat response of the human ear-brain system, that compensation is valid only when the music is played back at the same sound pressure level at which the compensation is applied. In case of live music where no compensation is applied, the desired playback attempts to reconstruct the same sound experience as the live performance. For these reasons, when compensating for loudness perception differences, it is not necessary to compensate for the non-flatness of the ear-brain system, but rather to compensate for the differences in playback levels. Other considerations include physical limitations of audio systems and compensation systems, the applicability of loudness measurements to the media to be played, and listener preferences.

Many researchers and engineers have contributed to the understanding of perceived loudness with respect to frequency variations and have derived perceived loudness versus frequency curves (Stevens, S. S., *Perceived Level of Noise by Mark VII and Decibels (E)*, Journal of the Acoustical Society of America, Vol. 51, pp. 575–601, 1972). Further work added to the body knowledge by generating a set of differential loudness curves of various playback sound pressure levels for each recording sound pressure level (Holman, T and Kampmann, F, *Loudness Compensation: Use and Abuse*, Journal of the Audio Engineering Society, Vol. 26, No. 7/8, July/August 1978). These curves may vary in gain and shape depending on the recording levels and playback levels. Although such understanding between recording and playback is desirable, it is not directly applicable because the sound pressure level of the music at the time of recording is typically not known. What is recorded is not the actual sound pressure level, but some electrical, mechanical or numerical representation of the sound pressure level, where the mapping between the sound pressure level and the recorded representation is not preserved. Therefore, conventional compensation systems use a general set of loudness curves and some mapping to the sensed recorded level or to the system volume control itself to approximate this functionality for all input music.

SUMMARY OF THE INVENTION

Accordingly, there is a need for a loudness compensation system that offers flexibility and configurability in the shape of the loudness compensation curves and the mapping back to the recorded sound pressure level to achieve the maximum listening pleasure.

In accordance with the present invention, a flexible and configurable digital loudness compensation system and method are provided which eliminate or substantially reduce the disadvantages associated with prior loudness compensators.

In one aspect of the invention, an audio loudness compensation system includes a level sensor receiving an audio input signal and operable to estimate a level of the audio input signal over a first predetermined time period, and a level mapper receiving the estimated level and operable to map the estimated level to a raw filter level in response to a slope setting and an offset setting. The system further includes an attack and decay filter receiving the raw audio gain, the antilog of the raw filter level, and operable to smooth out increasing and decreasing changes in the raw audio gain in response to a second predetermined time period, and a compensation filter receiving the smoothed raw audio gain and operable to modify the audio input signal in response to the smoothed raw audio gain, a center frequency setting and a bandwidth setting, and generate a loudness compensated audio output signal.

In another aspect of the invention, an audio loudness compensation system includes a level mapper receiving a volume control user input and operable to map the volume control user input to a raw filter level in response to a slope user input and an offset user input, the slope and offset user inputs describing a linear function to be applied to the raw level. The system further includes a compensation filter receiving the raw audio gain and operable to modify the audio input signal in response to the raw audio gain, a center frequency user input and a bandwidth user input, and generating a loudness compensated audio output signal.

In yet another aspect of the invention, a loudness compensation method includes the steps of receiving an input, mapping the input to a raw filter level using a slope input and an offset input, the slope and offset inputs defining a linear function, generating the raw gain by taking the antilog of the filter level, smoothing the raw audio gain, allpass filtering the input and generating a filtered input, and generating an audio output in response to the input and the smoothed raw audio gain.

BRIEF DESCRIPTION OF THE DRAWINGS

For a better understanding of the present invention, reference may be made to the accompanying drawings, in which.

DETAILED DESCRIPTION OF THE INVENTION

Figure 1:
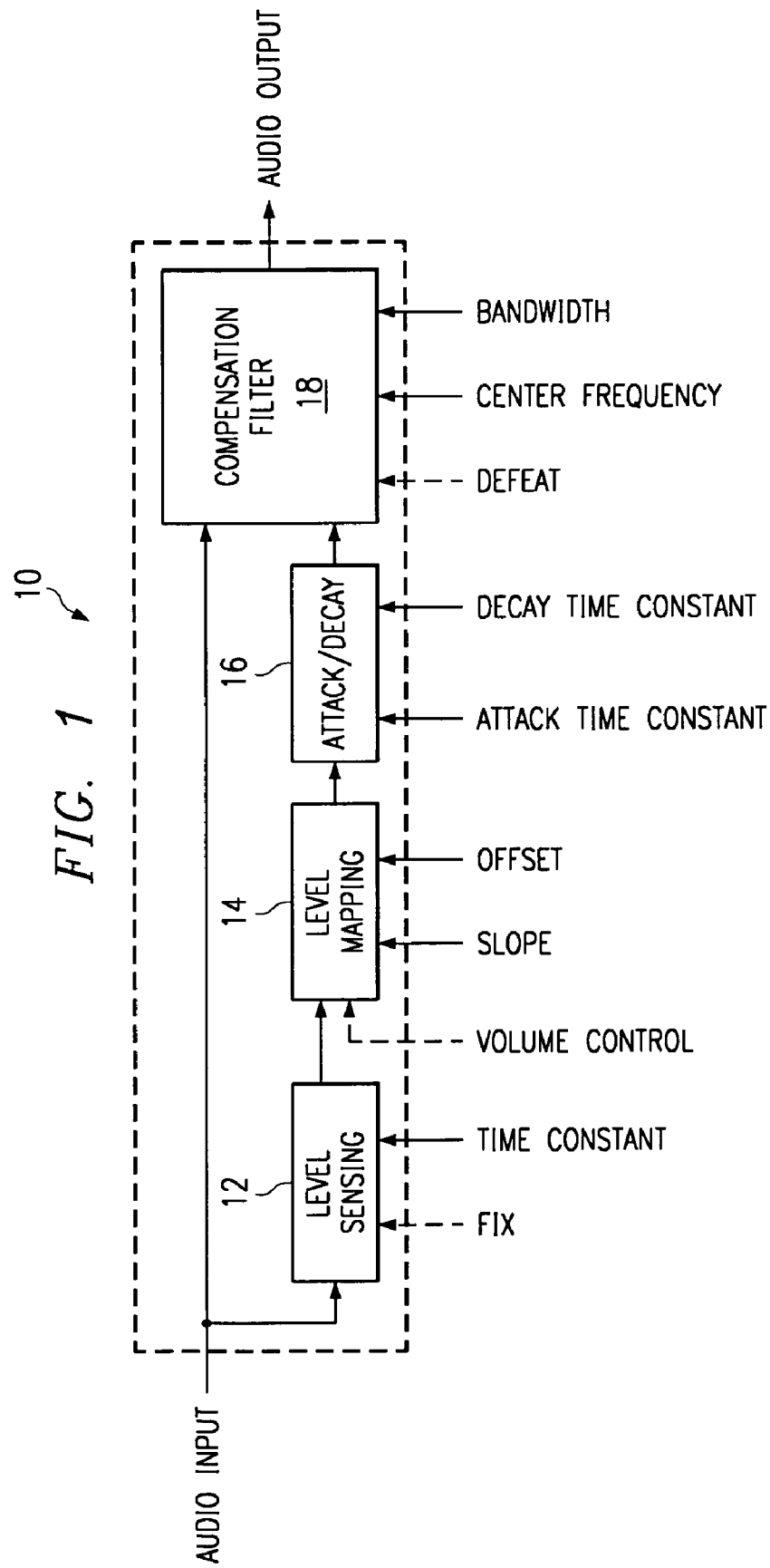
FIG. 1 is a simplified block diagram of an embodiment of a configurable digital loudness compensation system and method constructed according to the teachings of the present invention.

FIG. 1 is a simplified block diagram of an embodiment of a configurable digital loudness compensation system and method 10 constructed according to the teachings of the present invention. Only a single channel is shown for the sake of clarity. System and method 10 includes an automatic level sensing circuit subsystem or function 12, which receives the audio signal input and provides an estimate of the level of the signal over a predetermined period of time, indicated by the time constant input. Another input, fix, is a user-input which instructs level sensor 12 to maintain the gain of the loudness compensation at the current level. In this mode of operation, the offset input is a manual gain adjustment for loudness compensation and may be used to override the fix command.

The sensed level from level sensor 12 is provided to a level mapping circuit, subsystem, or function 14. Level mapper 14 applies a linear function, specified by a slope and an offset, to map the sensed level to the filter gain. By making slope and offset system inputs, the user may adjust the loudness compensation curve to suit his/her listening preferences.

In alternate embodiment, loudness compensation circuit and method 10 may track the volume control input or setting rather than the sensed sound level. In this embodiment, a user volume control input is received by level mapping circuit or function 14. Depending on whether the user volume control input has already been mapped to a gain value, the design of gain mapping circuit or function 14 may be tailored to the specific embodiment. Details of level mapping circuit or function 14 are presented below with reference to FIG. 3. The output from level mapper 14 is provided to attack and decay filters, subsystems, or functions 16. The primary function of attack and decay filtering is to prevent rapid changes in the filter gain to avoid undesirable audible artifacts. Attack and decay filtering receives an attack time constant, $\alpha_a$, and a decay time constant, $\alpha_d$, that regulate how fast the changes should take place.

The gain output from attack and decay block 16 is provided to a compensation filter or function 18 along with the audio input signal. Compensation filter 18 also receives a center frequency input and a bandwidth input. A defeat input to this block may be used to reset compensation filter 18 to 0 dB and cause it to ignore the gain setting from attack and decay block 16. Therefore, the defeat input allows the user to eliminate loudness compensation provided by system 10.

It should be noted that system and method 10 shown in FIG. 1 is applicable to multiple channels to apply the same loudness correction to each channel. Level sensing is performed for each channel, and the minimum level is then used to correct loudness for all the channels. The level mapping and attack and decay stages are common to all the channels. Compensation filtering is applied separately to each channel with the same gain value received from the attack and decay block. Alternatively, each channel can be loudness compensated separately with different gain values and different input parameters and settings.

Figure 2:
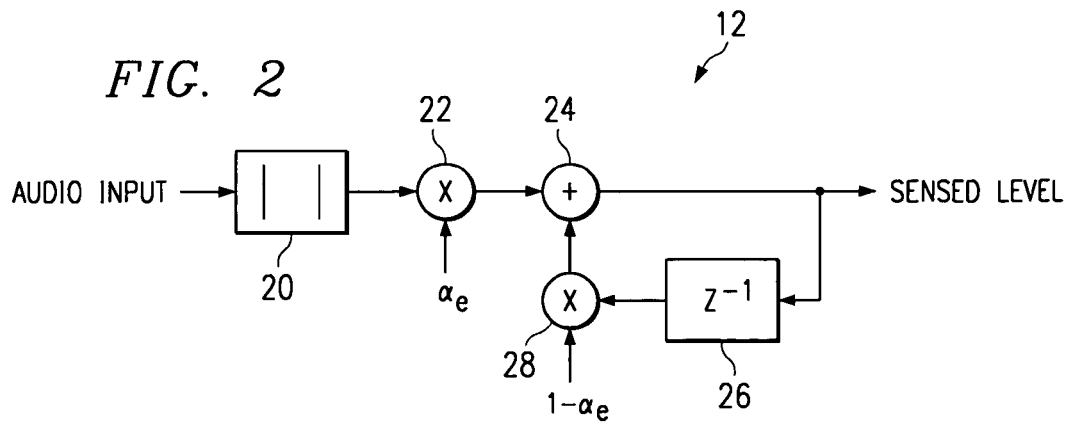
FIG. 2 is a more detailed block diagram of an embodiment of a level sensing circuit and method constructed according to the teachings of the present invention.

FIG. 2 is a more detailed block diagram of an embodiment of a level sensing circuit and method 12 constructed according to the teachings of the present invention. Level sensing block 12 comprises an absolute value circuit or function 20 which generates the absolute value of its input audio signal. In some conventional circuits, a squarer is used to compute an RMS value rather than the absolute value function. Either approach is acceptable and the system can be configured accordingly. The absolute value of the input audio signal is then provided to a first order IIR filter commonly known as an alpha filter. The alpha filter includes a first multiplier 22, which multiplies the absolute value of the input audio signal with a time constant, $\alpha_e$. The product from multiplier 22 is provided to a summer 24. A previous level output is received from a delay block ($Z^{-1}$) 26 which adds a predetermined amount of delay and provides the previous output to a second multiplier 28. Second multiplier 28 multiplies the previous output and ($1-\alpha_e$) and provides the product to summer 24. Summer 24 then receives the product from multiplier 22 and sums it with the previous output multiplied with ($1-\alpha_e$). The output from level sensing block 12 is an estimate of the sound level of the input audio signal over a period of time determined by $\alpha_e$. The fix command or input shown in FIG. 1 may be implemented by setting the time constant, $\alpha_e$, to zero.

Figure 3:
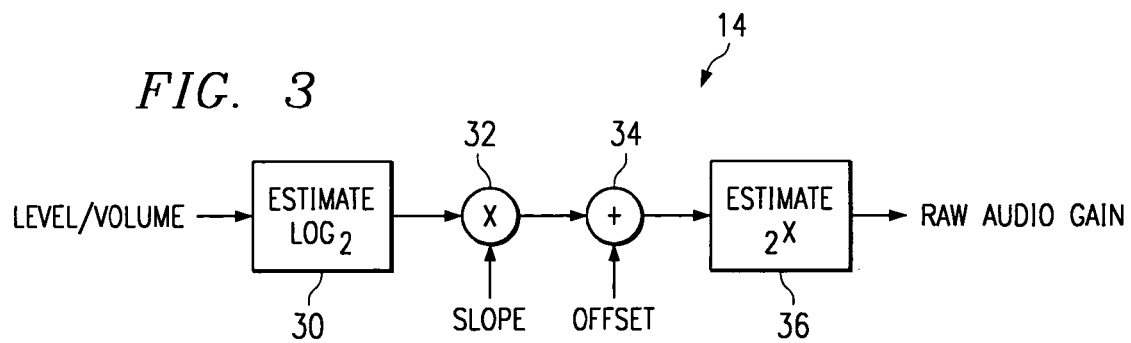
FIG. 3 is a more detailed block diagram of an embodiment of a level mapping circuit and method constructed according to the teachings of the present invention.

FIG. 3 is a more detailed block diagram of an embodiment of a level mapping circuit and function 14 constructed according to the teachings of the present invention. Level mapping circuit or 14 includes a base 2 logarithmic block 30, which converts the sensed level input from level sensing block 12 to the base 2 logarithmic space. A multiplier 32 then multiplies a slope input with the base 2 logarithm of the sensed level. A summer 34 then applies or sums an offset input with the output from multiplier 32. Multiplier 32 and summer 34 perform a linear mapping function of the sensed level by a slope and offset specified by the user, which describe the loudness compensation curve. The output from summer 34 is then converted back to linear space by an antilogarithm block 36. The output from antilogarithm block 36 is the raw audio gain. Level mapping 14 is shown implemented with base 2 logarithmic and antilogarithmic circuits, functions, or algorithms, where the level is estimated in the base 2 logarithmic domain. Details of this simplification process is described in U.S. patent application Ser. No. 09/192,981, titled *Digital Signal Processing Circuits, Systems, and Methods Implementing Approximations for Logarithm and Inverse Logarithm*. Level mapping is a simple linear function within the base 2 logarithmic space. Level mapping may also be done in the conventional base 10 logarithmic or dB space. It can also be done by using actual logarithmic functions rather than estimates.

In an alternative embodiment, loudness compensating system 10 of the present invention may track the volume control or setting provided by the user. In this embodiment, a volume control input is received by level mapping circuit or function 14 and used to generate the raw audio gain output. The volume control input may already have been processed by a dB-to-gain mapping interface elsewhere in the audio system. If so, the logarithmic conversion circuit or function 30 is not needed. The volume control input is simply provided as an input to multiplier 32 to be multiplied with the slope. If the volume control is not provided as a dB input to level mapping circuit 14, then it is converted by logarithm circuit or function 30 before it is processed by multiplier 32 and summer 34 as described above.

Figure 4:
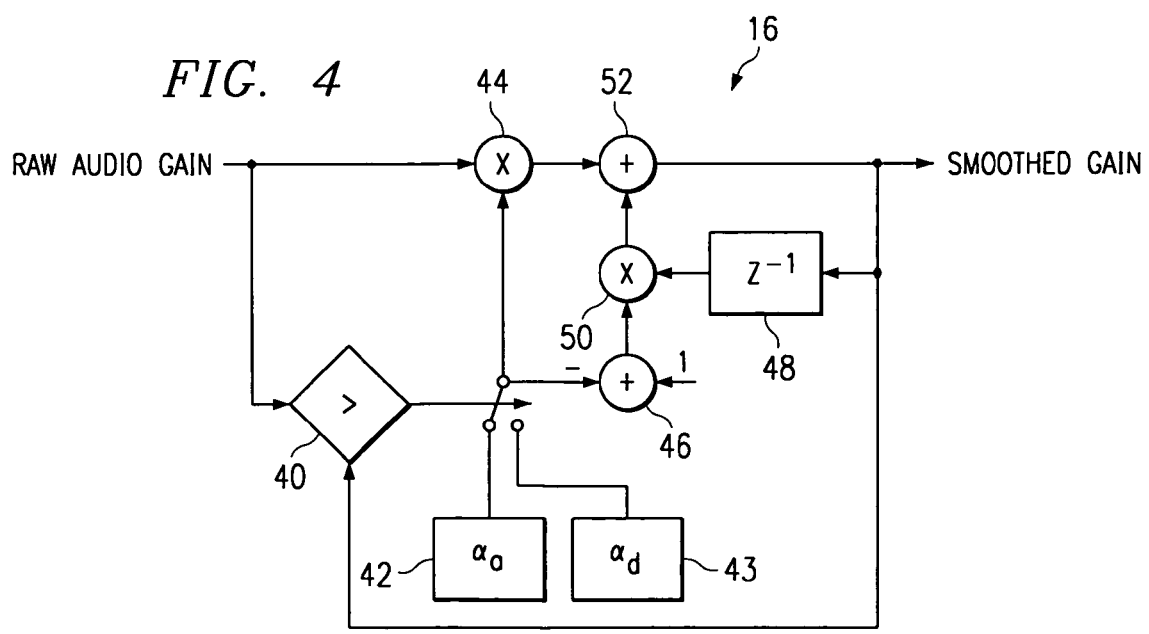
FIG. 4 is a more detailed block diagram of an embodiment of attack and decay filters and methods constructed according to the teachings of the present invention.

FIG. 4 is a more detailed block diagram of an embodiment of attack and decay filters and methods 16 constructed according to the teachings of the present invention. Attack and decay filtering function 16 includes a comparison circuit or function 40 that compares the input, which is the newly computed gain or the raw audio gain, with the output, which is the previous gain. If the new gain is greater than the previous gain, then attack filtering is needed and the attack time constant 42, $\alpha_a$, is selected. If the new gain is less than the previous gain, then decay filtering is needed and the decay time constant 43, $\alpha_d$, is selected. The selected time constant is then provided to a first order IIR filter or alpha filter encompassing multiplier 44, summer 52, multiplier 50, summer 46 and delay 48. Multiplier 44 multiplies the selected time constant with the newly computed gain input and is then summed with the product of the previous gain from delay block 48 and one minus the selected time constant. As a result, the attack and decay filtering prevent instantaneous gain changes, which lead to audible artifacts, and also allow the time constant to be adjusted when the gain changes so that the least amount of interference is introduced.

In some systems, the user volume control input is mapped to gain and also smoothed to avoid audible artifacts. If this smoothed volume control is received as the input at level mapping circuit or function 14, then attack and decay filtering may become unnecessary.

Figure 5:
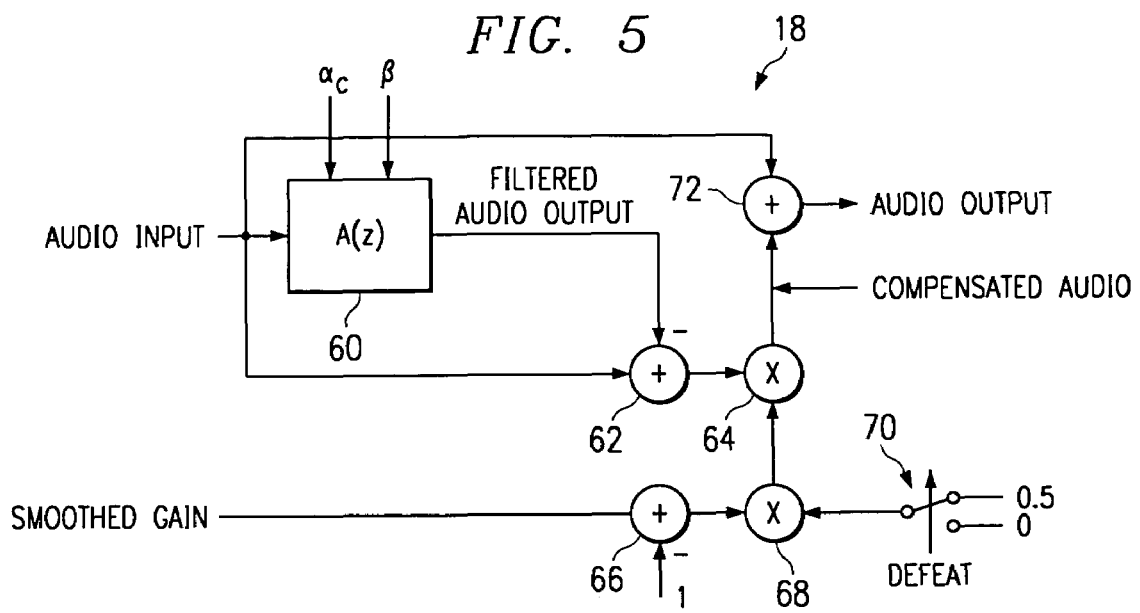
FIG. 5 is a more detailed block diagram of an embodiment of a compensation filter and method constructed according to the teachings of the present invention.

FIG. 5 is a more detailed block diagram of an embodiment of a compensation filter and method 18 constructed according to the teachings of the present invention. Compensation filter 18 essentially implements a bandpass filter with variable gain. Compensation filter 18 includes an allpass filter 60, A(z), which filters the audio input signal according to a center frequency input, $\alpha_c$, and a bandwidth input, $\beta$. Allpass filter 60 may be a second order filter described by:

$$A(z) = \frac{\beta + \alpha(1+\beta)z^{-1} + z^{-2}}{1 + \alpha(1+\beta)z^{-1} + \beta z^{-2}}$$

The filtered audio signal from allpass filter 60 is provided to a summer 62, which determines a difference between the filtered audio signal and the unfiltered audio signal, and provides the difference to a multiplier 64. The computed gain from attack and decay filters 16 is received by a summer 66 and subtracted from one (1). The result is supplied to a multiplier 68, which multiplies the result by zero (0) or some predetermined constant, such as 0.5, shown selected by a selector 70. Selector 70 is operated by the defeat input or command, D, issued by the user to neutralize loudness compensation. The result of the operation by multiplier 68 is supplied to multiplier 64, which then multiplies the process gain input with the difference between the audio input signal and the filtered audio signal from summer 62. The output from multiplier 64 is a processed gain value that is then summed with the audio input signal by summer 72 to produce the audio output signal with loudness compensation.

Allpass filter 60 may also be implemented with other filter structures, such as an embedded direct form I allpass filter structure described in Dattorro, J., *Effect Design: Part 1: Reverberator and Other Filters*, Journal of the Audio Engineering Society, Vol. 45, No. 9, September, 1997.

Figure 6:
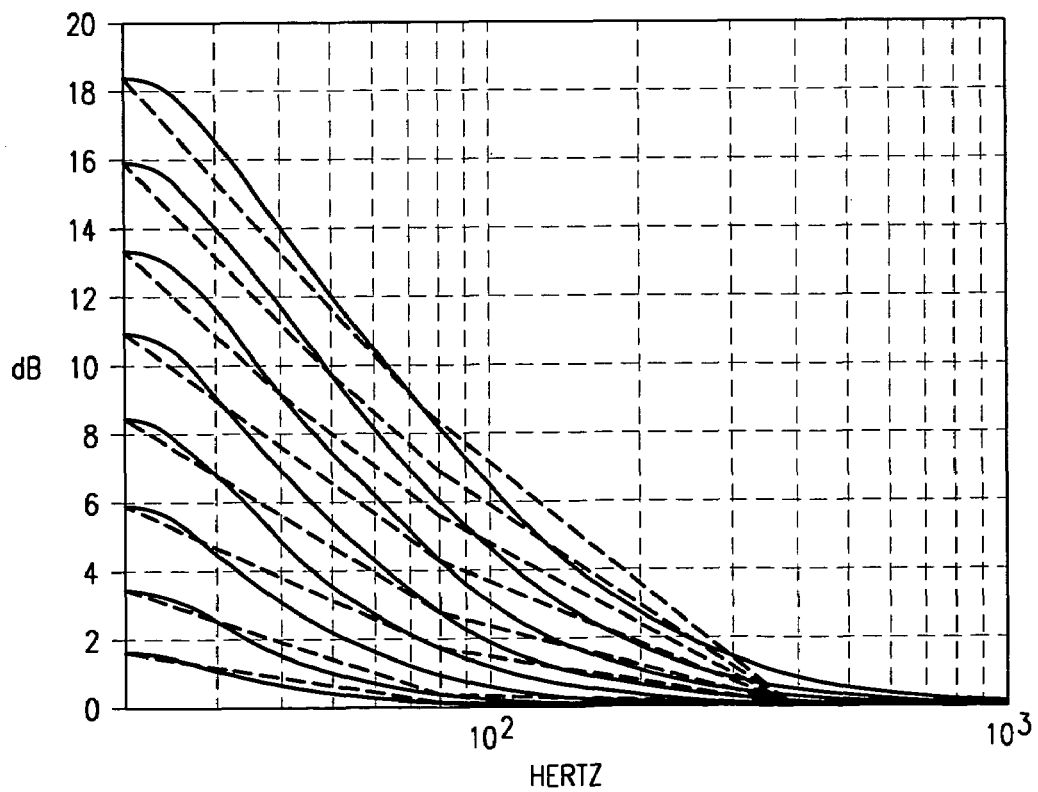
FIG. 6 is a plot of exemplary frequency response curves of the allpass filter of FIG. 6 according the teachings of the present invention.

FIG. 6 is a plot of exemplary frequency response curves of the allpass filter of FIG. 6 according the teachings of the present invention. In particular, the plot shows the frequency response curves arising from setting $\alpha_c=-0.9999959$ and $\beta=0.9967994$. It may be seen that this is a reasonable approximation to the 85 dB difference curves published by Holman, T and Kampmann, F, which derives the differences in the loudness versus frequency curves described in Stevens, S. S., *Perceived Level of Noise by Mark VII and Decibels (E)*, Journal of the Acoustical Society of America, Vol. 51, pp. 575–601, 1972.

Constructed and operating in this manner, the loudness compensator offers configurability in not only the loudness compensation curves but also the shape of the loudness compensation curves, as well as the mapping back to the recorded sound levels. Further, the same system design is adaptable to applications where volume control tracking is desired for loudness control. As a result, the user or the system designer has flexibility to tailor the system behavior according to special applications or personal preferences.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. An audio loudness compensation system, comprising:
    a level sensor receiving an audio input signal and operable to estimate a level of the audio input signal over a first predetermined time period;
    a level mapper receiving the estimated level and operable to map the estimated level to a raw audio gain in response to a slope setting and an offset setting;
    a compensation filter receiving the raw audio gain and operable to modify the audio input signal in response to the raw audio gain, a center frequency setting and a bandwidth setting, and generate a loudness compensated audio output signal; and
    an attack and decay filter receiving the raw audio gain and operable to smooth out increasing and decreasing changes in the raw audio gain in response to a second predetermined time period, and the compensation filter receiving and operating in response to the smoothed raw audio gain.

2. The system, as set forth in claim 1, wherein the compensation filter comprises a bandpass filter.

3. The system, as set forth in claim 1, wherein the compensation filter comprises:
    an allpass filter receiving the audio input signal and operable to filter the audio input signal in response to the center frequency setting and the bandwidth setting, and generate a filtered audio input signal;
    a gain circuit operable to generate a compensation gain value in response to the smoothed raw audio gain; and
    an output circuit operable to generate an audio output signal in response to the compensation gain value and the filtered audio input signal.

4. The system, as set forth in claim 1, wherein the compensation filter comprises:
    an allpass filter receiving the audio input signal and operable to filter the audio input signal in response to the center frequency setting and the bandwidth setting, and generate a filtered audio input signal;

a first summer operable to determine a difference between the audio input signal and the filtered audio input signal and generate a difference audio input signal;

a gain circuit operable to generate a compensation gain value in response to the smoothed raw audio gain;

a multiplier operable to multiply the difference audio input signal with the compensation gain value and generate a compensated audio input signal; and a second summer operable to sum the compensated audio input signal and the audio input signal and generate the audio output signal.

5. The system, as set forth in claim 4, wherein the gain circuit comprises a selector operable to select between a first gain multiplier value and a second gain multiplier value in response to a user-input, and the gain circuit generating the compensation gain value in response to the selected gain multiplier.

6. The system, as set forth in claim 5, wherein the first gain multiplier is zero.

7. The system, as set forth in claim 5, wherein the second gain multiplier is 0.5.

8. An audio loudness compensation system, comprising:

a level sensor receiving an audio input signal and operable to estimate a level of the audio input signal over a first predetermined time period;

a level mapper receiving the estimated level and operable to map the estimated level to a raw audio gain in response to a slope setting and an offset setting; and a compensation filter receiving the raw audio gain and operable to modify the audio input signal in response to the raw audio gain, a center frequency setting and a bandwidth setting, and generate a loudness compensated audio output signal, wherein the level sensor comprises:

an absolute value circuit operable to determine the absolute value of the audio input signal; and a filter operable to filter the absolute value of the audio input signal in response to a time constant.

9. The system, as set forth in claim 8, wherein the filter is an alpha filter.

10. The system, as set forth in claim 9, wherein the logarithm block is operable to estimate the base 2 logarithm of the estimated level, and the antilogarithm block is operable to estimate the base 2 antilogarithm of the filter gain.

11. An audio loudness compensation system, comprising:

a level sensor receiving an audio input signal and operable to estimate a level of the audio input signal over a first predetermined time period;

a level mapper receiving the estimated level and operable to map the estimated level to a raw audio gain in response to a slope setting and an offset setting; and a compensation filter receiving the raw audio gain and operable to modify the audio input signal in response to the raw audio gain, a center frequency setting and a bandwidth setting, and generate a loudness compensated audio output signal, wherein the level mapper comprises:

a logarithm block operable to determine the logarithm of the estimated level;

a mapping block operable to map the estimated level to the filter gain in the logarithm domain; and an antilogarithm block operable to determine the antilogarithm of a filter gain.

12. An audio loudness compensation system, comprising:

a level sensor receiving an audio input signal and operable to estimate a level of the audio input signal over a first predetermined time period;

a level mapper receiving the estimated level and operable to map the estimated level to a raw audio gain in response to a slope setting and an offset setting; and a compensation filter receiving the raw audio gain and operable to modify the audio input signal in response to the raw audio gain, a center frequency setting and a bandwidth setting and generate a loudness compensated audio output signal, wherein the level mapper comprises:

a logarithm block operable to determine the logarithm of the estimated level;

a multiplier operable to multiply the logarithm of the estimated level with the gain setting and generate a level;

a summer operable to add the offset setting to the level and generate the filter gain in the logarithm domain; and an antilogarithm block operable to determine the antilogarithm of a filter gain.

13. An audio loudness compensation system, comprising:

a level mapper receiving a volume control user input and operable to map the volume control user input to a raw audio gain in response to a slope user input and an offset user input, the slope and offset user inputs describing a linear function to be applied to the input level; and a compensation filter receiving the raw audio gain and operable to modify the audio input signal in response to the raw audio gain, a center frequency user input and a bandwidth user input, and generating a loudness compensated audio output signal, wherein the compensation filter comprises:

an allpass filter receiving the audio input signal and operable to filter the audio input signal in response to the center frequency user input and the bandwidth user input, and generate a filtered audio input signal;

a gain circuit operable to generate a compensation gain value in response to the smoothed raw audio gain; and an output circuit operable to generate an audio output signal in response to the compensation gain value and the filtered audio input signal.

14. The system, as set forth in claim 13, wherein the compensation filter comprises a bandpass filter.

15. An audio loudness compensation system, comprising:

a level mapper receiving a volume control user input and operable to map the volume control user input to a raw audio gain in response to a slope user input and an offset user input, the slope and offset user inputs describing a linear function to be applied to the input level; and a compensation filter receiving the raw audio gain and operable to modify the audio input signal in response to the raw audio gain, a center frequency user input and a bandwidth user input, and generating a loudness compensated audio output signal, wherein the compensation filter comprises:

an allpass filter receiving the audio input signal and operable to filter the audio input signal in response to the center frequency user input and the bandwidth user input, and generate a filtered audio input signal;

a first summer operable to determine a difference between the audio input signal and the filtered audio input signal and generate a difference audio input signal;

a gain circuit operable to generate a compensation gain value in response to the smoothed raw audio gain;

a multiplier operable to multiply the difference audio input signal with the compensation gain value and generate a compensated audio input signal; and a second summer operable to sum the compensated audio input signal and the audio input signal and generate the audio output signal.

16. The system, as set forth in claim 15, wherein the gain circuit comprises a selector operable to select between a first gain multiplier value and a second gain multiplier value in response to a user-input, and the gain circuit generating the compensation gain value in response to the selected gain multiplier.

17. The system, as set forth in claim 16, wherein the first gain multiplier is zero.

18. The system, as set forth in claim 16, wherein the second gain multiplier is 0.5.

19. An audio loudness compensation system, comprising:

a level mapper receiving a volume control user input and operable to map the volume control user input to a raw audio gain in response to a slope user input and an offset user input, the slope and offset user inputs describing a linear function to be applied to the input level; and a compensation filter receiving the raw audio gain and operable to modify the audio input signal in response to the raw audio gain, a center frequency user input and a bandwidth user input, and generating a loudness compensated audio output signal, wherein the level mapper comprises:

a logarithm block operable to determine the logarithm of the estimated level;

a mapping block operable to map the estimated level to the filter gain in the logarithm domain; and an antilogarithm block operable to determine a antilogarithm of the filter gain.

20. An audio loudness compensation system, comprising:

a level mapper receiving a volume control user input and operable to map the volume control user input to a raw audio gain in response to a slope user input and an offset user input, the slope and offset user inputs describing a linear function to be applied to the input level; and a compensation filter receiving the raw audio gain and operable to modify the audio input signal in response to the raw audio gain, a center frequency user input and a bandwidth user input, and generating a loudness compensated audio output signal, wherein the level mapper comprises:

a logarithm block operable to determine the logarithm of the estimated level;

a multiplier operable to multiply the logarithm of the estimated level with the slope setting and generate a gain;

a summer operable to add the offset setting to the gain and generate the filter gain in the logarithm domain; and an antilogarithm block operable to determine a antilogarithm of the filter gain.

21. The system, as set forth in claim 20, wherein the logarithm block is operable to estimate the base 2 logarithm of the estimated level, and the antilogarithm block is operable to estimate the base 2 antilogarithm of the filter gain.

22. An audio loudness compensation system, comprising:

a level mapper receiving a volume control user input and operable to map the volume control user input to a raw audio gain in response to a slope user input and an offset user input, the slope and offset user inputs describing a linear function to be applied to the input level; and a compensation filter receiving the raw audio gain and operable to modify the audio input signal in response to the raw audio gain, a center frequency user input and a bandwidth user input, and generating a loudness compensated audio output signal, further comprising an attack and decay filter receiving the raw audio gain and operable to smooth out increasing and decreasing changes in the raw audio gain in response to predetermined time constants.

23. A loudness compensation method, comprising:

receiving an audio input;

mapping the audio input to a filter level using a slope input and an offset input, the slope and offset inputs defining a linear function converting the filter level to a raw audio gain;

smoothing the raw audio gain;

allpass filtering the input and generating a filtered input; and generating an audio output in response to the filtered input and the smoothed raw audio gain, further comprising estimating a level of the audio input over a predetermined time period, and generating the output, wherein estimating the level comprises taking the absolute value of the audio input and low pass filtering the absolute value of the audio input to generate the input.

24. A loudness compensation method, comprising:

receiving an audio input;

mapping the audio input to a filter level using a slope input and an offset input, the slope and offset inputs defining a linear function converting the filter level to a raw audio gain;

smoothing the raw audio gain;

allpass filtering the input and generating a filtered input; and generating an audio output in response to the filtered input and the smoothed raw audio gain, further comprising estimating a level of the audio input over a predetermined time period, and generating the output, wherein mapping the level comprises:

estimating a base 2 logarithm of the input;

multiplying the base 2 logarithm of the input with the slope input and generating a product;

summing the product with the offset input and generating a sum; and estimating a base 2 antilogarithm of the sum.

\* \* \* \* \*